(12) United States Patent
Utsumi

(10) Patent No.: US 7,003,468 B2
(45) Date of Patent: Feb. 21, 2006

(54) METHOD, APPARATUS, AND PROGRAM FOR ENVELOPE GENERATION, AUDIO COMPRESSION, AND AUDIO EXPANSION

(75) Inventor: Kiyoomi Utsumi, Kanagawa-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 696 days.

(21) Appl. No.: 09/893,083

(22) Filed: Jun. 27, 2001

(65) Prior Publication Data

US 2003/0004732 A1 Jan. 2, 2003

(30) Foreign Application Priority Data

Jun. 27, 2000 (JP) ............................... 2000-193204

(51) Int. Cl.
*G10L 19/00* (2006.01)

(52) U.S. Cl. ...................... 704/500; 704/501; 704/503; 704/504; 381/107

(58) Field of Classification Search ................ 381/107; 704/500–505; 375/354
See application file for complete search history.

(56) References Cited

U.S. PATENT DOCUMENTS 5,530,768 A * 6/1996 Yoshizumi .................. 381/107

FOREIGN PATENT DOCUMENTS

JP 04-336705 5/1991
JP 06-164277 11/1992

OTHER PUBLICATIONS

Partial translation of cited reference 1(Patent Laid-Open Publication No. H06-164277) with attached drawings of figures 1 & 2.
Partial translation of cited reference 2 (Patent Laid-Open Publication No. H04-336705) with attached drawings of figures 1 & 2.

* cited by examiner

*Primary Examiner*—W. R. Young
*Assistant Examiner*—Huyen X. Vo
(74) *Attorney, Agent, or Firm*—Pearne & Gordon LLP

(57) ABSTRACT

An envelope generator (20), comprises: an input terminal (20*a*) for having a signal inputted therein; a first integrator (21) for generating intermediate state of envelopes with a first attack time and a first release time in response to changes in level of said signal inputted through said input terminal (20*a*) to impart said intermediate state of envelopes to said signal; a second integrator (22) for respectively modifying said intermediate state of envelopes into final state of envelopes with a second attack time and a second release time in response to changes in level of said signal imparted said intermediate state of envelopes; and an output terminal (20*d*) for outputting said signal with said final state of envelopes therethrough. The envelope generator (20) thus constructed can make gain signal follow rapid fluctuations in level of an audio signal, and can impart a relatively high quality for compressing and expanding level of the audio signal not to break in shape.

9 Claims, 12 Drawing Sheets

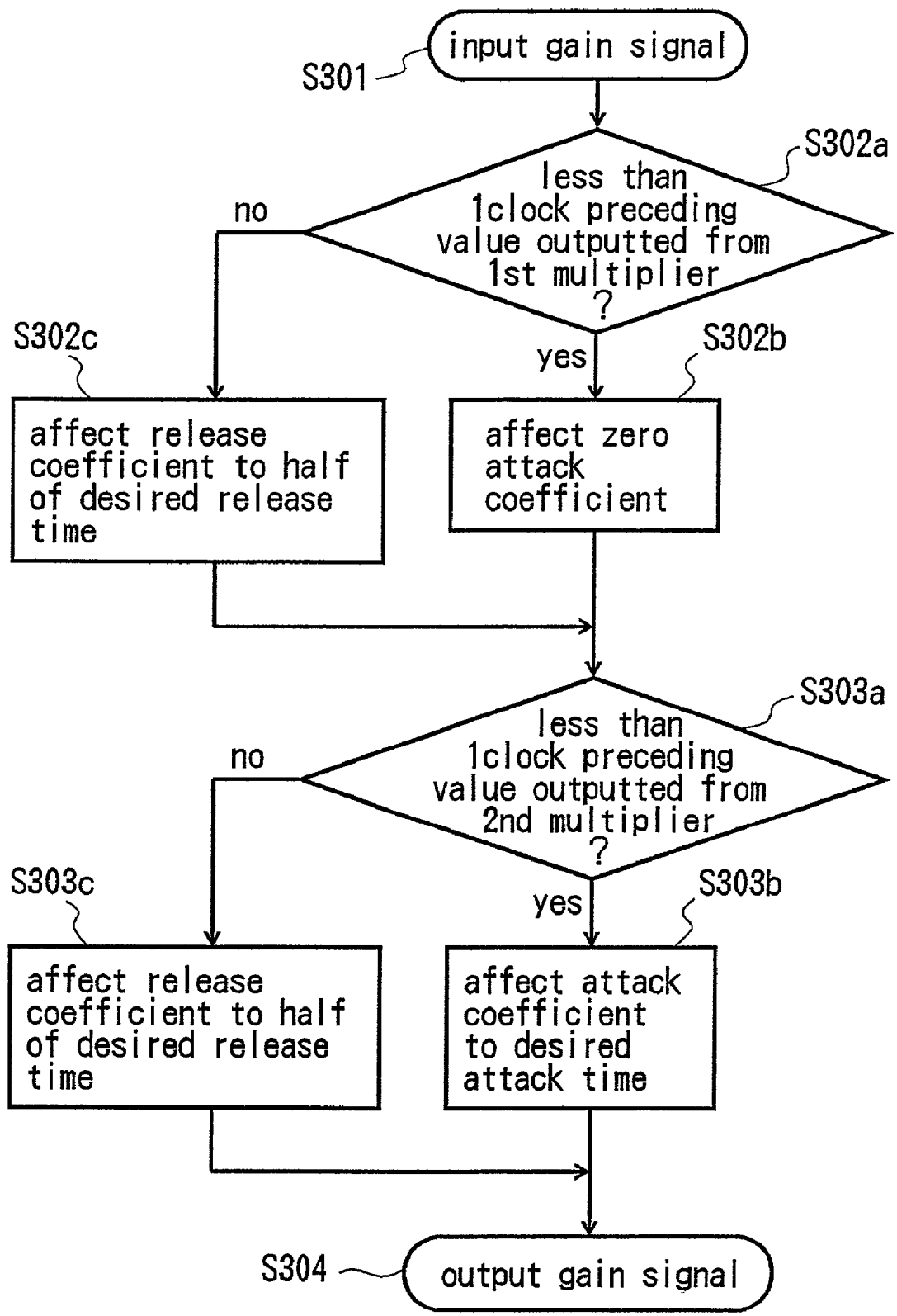
F I G. 3

METHOD, APPARATUS, AND PROGRAM FOR ENVELOPE GENERATION, AUDIO COMPRESSION, AND AUDIO EXPANSION

BACKGROUND OF THE INVENTION

1. Field of the Invention

The present invention relates to an envelope generator, an audio compression apparatus, an audio expansion apparatus, an envelope generation method, an audio compression method, an audio expansion method, an envelope generation program, an audio compression program, and an audio expansion program, and more particularly to audio compression and audio expansion functions for multiplying an audio signal by a gain according to level of the audio signal, and to an envelope generation function for smoothing rapid fluctuations of the gain according to desired time constants, in a signal processing apparatus such as an audio mixer or a signal processing chip that can adjust the audio signals.

2. Description of the Related Art

Up until now, there have been proposed a wide variety of audio compression apparatuses for compressing the level of an audio signal inputted therein, and a wide variety of audio expansion apparatuses for expanding the level of an audio signal inputted therein. Also, there have been proposed various types of envelope generator for generating envelopes in level of a signal to impart the envelope to the signal such as a gain signal.

One typical example of the conventional audio compression apparatuses is shown in FIG. 12. The conventional audio compression apparatus 60 comprises a sampling element 61, a subtracter 62, a gain generator 63, a multiplier 64, an integrator 30 as an typical example of a conventional envelope generator, an audio signal input terminal 60a, a threshold value input terminal 60b, a compression ratio input terminal 60c, an attack coefficient input terminal 60d, a release coefficient input terminal 60e, and an audio signal output terminal 60f.

Description will now be made on how such an audio signal is compressed in level by the conventional audio compression apparatus 60.

When the audio signal fluctuating in level is inputted into the audio signal input terminal 60a, the sampling element 61 is operated to periodically sample the audio signal at a predetermined sampling cycle to obtain an absolute value in level of the audio signal. The subtracter 62 serves to acquire a difference between the absolute value in level of the audio signal and the predetermined threshold value inputted through the threshold value input terminal 60b. The gain generator 63 is operative to generate a gain signal based on the predetermined compression ratio inputted through the compression ratio input terminal 60c and on the difference between the absolute value and the threshold value. When the level of audio signal becomes larger than the threshold value, the level of the gain signal is changed from "1" to less than "1", e.g., from "1" to "0.8". If the gain signal generated by the gain generator 30 is directly inputted into the multiplier 64 and the audio signal is directly multiplied by the gain signal, the audio signal outputted from the audio signal output terminal 60f is reduced to be extremely out of shape. The reason is due to the fact that the gain signal is restored, e.g., from "0.8" to "1" when the level of the audio signal in the form of such as a sine wave shape returns to the threshold value. For this reason, the gain signal generated by the gain generator 63 is inputted into the integrator 30, and the integrator 30 generates envelopes in level of the gain signal during particular periods corresponding especially to a release time when the level of the gain signal returns to an initial level. The multiplier 64 is then operated to multiply the audio signal from the audio signal input terminal 60a by the gain signal imparted the envelopes by the integrator 30.

The integrator 30 is shown in FIG. 2 as a typical type of a conventional envelope generator, and comprises a adder 31, a delay element 32, a subtracter 33, an attack coefficient multiplier 34, a release coefficient multiplier 35, a switch 36, a gain signal input terminal 30a, an attack coefficient input terminal 30b, a release time coefficient input terminal 30c, and a gain signal output terminal 30d.

The gain signal input terminal 30a has a gain signal inputted therein. The delay element 32 is operative to delay the signal by one sampling cycle. The subtracter 33 is operative to subtract the level of the gain signal from the one sampling cycle preceding level of the gain signal and to output a signal having a level indicative of the deference between the destination gain and the one sampling cycle preceding gain. The attack coefficient multiplier 34 is operative to multiple the level of the signal from the subtracter 33 by the attack coefficient inputted through the attack coefficient input terminal 30b. The release coefficient multiplier 35 is operative to multiple the level of the signal from the subtracter 33 by the release coefficient inputted through the release coefficient input terminal 30c. The switch 36 is operative to connect the attack coefficient multiplier 34 with the adder 31 during the attack time, and to connect the release coefficient multiplier 35 with the adder 31 during the release time, based on the level of the signal from subtracter 33. The adder 31 is operative to add the level of the gain signal from the gain signal input terminal 30a to the level of the signal from the switch 36. The gain signal output terminal 30d is operative to output the gain signal imparted with the envelopes therethrough.

The conventional audio compression apparatus, however, encounters problems as described below.

In the case that the desired attack time is zero, and a sine wave shape of audio signal is inputted into the audio signal input terminal 60a and, when an amplitude of the audio signal becomes larger than the predetermined threshold value, the integrator 30 immediately follows the change of the gain signal generated by the gain generator 63, so that the level of the gain signal outputted from the integrator 30 also immediately becomes a destination level. The integrator 30 is operated to have the level of the gain signal maintained on the basis of the release coefficient inputted through the release coefficient input terminal 60e, thereby making it possible to have the audio signal outputted through the audio signal output terminal 60f compressed in a desired shape.

However, in the case that the desired attack time is larger than zero, e.g., the equal to the cycle of the sine wave shape of the audio signal and, when an amplitude of that audio signal becomes larger than the predetermined threshold value, the integrator 30 intends to take an desired attack time following the change of the gain signal generated by the gain generator 63, then the gain generator 30 follows a drop of the absolute value in level of the audio signal before the end of the attack time. Therefore, the level of the gain signal outputted from integrator 30 by no means reach the destination level, with the result that the audio signal outputted through the audio signal output terminal 60f is compressed in an undesired shape. Thus, the audio signal outputted from the conventional audio compression apparatus comes to be out of shape.

The conventional audio expansion apparatus is similar to the conventional audio compression apparatus, except for expanding the audio signal in the place of compressing the audio signal, so that the audio signal outputted from the conventional audio expansion apparatus becomes out of shape.

In order to solve this kind of problems, there has so far been proposed an apparatus for calculating moving averages of the absolute value in level of audio signal each having a period longer than one cycle of the audio signal to have the gain signal smoothed based on the moving average. This kind of apparatus, however, can not follow the rapid fluctuation of the level of the audio signal, and is complicated in construction.

SUMMARY OF THE INVENTION

It is therefore an object of the present invention to provide an envelope generator, an audio compression apparatus, an audio expansion apparatus, an envelope generation method, an audio compression method, an audio expansion method, an envelope generation program, an audio compression program, and an audio expansion program, which make gain signal follow rapid fluctuations in level of an audio signal.

It is another object of the present invention to provide an envelope generator, an audio compression apparatus, an audio expansion apparatus, an envelope generation method, an audio compression method, an audio expansion method, an envelope generation program, an audio compression program, and an audio expansion program, which can impart a relatively high quality for compressing and expanding level of the audio signal not to break in shape.

It is a further object of the present invention to provide an envelope generator, an audio compression apparatus, and an audio expansion apparatus, which can be simple in construction.

According to the first aspect of the present invention, there is provided an envelope generator, comprising: an input terminal for having a signal inputted therein; a first integrator for generating intermediate state of envelopes with a first attack time and a first release time in response to changes in level of said signal inputted through said input terminal to impart said intermediate state of envelopes to said signal; a second integrator for respectively modifying said intermediate state of envelopes into final state of envelopes with a second attack time and a second release time in response to changes in level of said signal imparted said intermediate state of envelopes; and an output terminal for outputting said signal with said final state of envelopes therethrough.

According to the second aspect of the present invention, there is provided an audio compression apparatus, comprising: An audio compression apparatus, comprising: an input terminal for having an audio signal inputted therein; a sampling element for periodically sampling said audio signal to obtain an absolute value in level of said audio signal; a subtracter for acquiring a difference between said absolute value and a predetermined threshold value; a gain generator for generating a gain signal based on said difference between said absolute value and said predetermined threshold value; an envelope generator including a first integrator for generating intermediate state of envelopes with a first attack time and a first release time in response to changes in level of said gain signal to impart said intermediate state of envelopes to said gain signal, and a second integrator for respectively modifying said intermediate state of envelopes into final state of envelopes with a second attack time and a second release time in response to changes in level of said gain signal imparted said intermediate state of envelopes; a multiplier for multiplying said audio signal by said gain signal with said final state of envelopes; and an output terminal for outputting said audio signal multiplied by said gain signal therethrough.

According to the third aspect of the present invention, there is provided an audio expansion apparatus, comprising: an input terminal for having an audio signal inputted therein; a sampling element for periodically sampling said audio signal to obtain an absolute value in level of said audio signal; a subtracter for acquiring a difference between said absolute value and a predetermined threshold value; a gain generator for generating a gain signal based on said difference between said absolute value and said predetermined threshold value; an envelope generator including a first integrator for generating intermediate state of envelopes with a first attack time and a first release time in response to changes in level of said gain signal to impart said intermediate state of envelopes to said gain signal, and a second integrator for respectively modifying said intermediate state of envelopes into final state of envelopes with a second attack time and a second release time in response to changes in level of said gain signal imparted said intermediate state of envelopes; a multiplier for multiplying said audio signal by said gain signal with said final state of envelopes; and an output terminal for outputting said audio signal multiplied by said gain signal therethrough.

According to the fourth aspect of the present invention, there is provided an envelope generation method, comprising: a first step of having a signal inputted; a second step of generating intermediate state of envelopes with a first attack time and a first release time in response to changes in level of said signal inputted in said first step; a third step of respectively modifying said intermediate state of envelopes into final state of envelopes with a second attack time and a second release time in response to changes in level of said signal imparted said intermediate state of envelopes; and a fourth step of outputting said signal with said final state of envelopes.

According to the fifth aspect of the present invention, there is provided an audio compression method, comprising: An audio compression method, comprising: a first step of having an audio signal inputted; a second step of periodically sampling said audio signal to obtain an absolute value in level of said audio signal; a third step of acquiring a difference between said absolute value and a predetermined threshold value; a fourth step of generating a gain signal based on said difference between said absolute value and said predetermined threshold value; a fifth step of generating intermediate state of envelopes with a first attack time and a first release time in response to changes in level of said gain signal to impart said intermediate state of envelopes to said gain signal; a sixth step of modifying said intermediate state of envelopes into final state of envelopes with a second attack time and a second release time in response to changes in level of said gain signal imparted said intermediate state of envelopes; a seventh step of multiplying said audio signal by said gain signal with said final state of envelopes; and an eighth step of outputting said audio signal multiplied by said gain signal.

According to the sixth aspect of the present invention, there is provided an audio expansion method, comprising: a first step of having an audio signal inputted; a second step of periodically sampling said audio signal to obtain an absolute value in level of said audio signal; a third step of acquiring a difference between said absolute value and a predetermined threshold value; a fourth step of generating a gain signal based on said difference between said absolute value and said predetermined threshold value; a fifth step of generating intermediate state of envelopes with a first attack time and a first release time in response to changes in level of said gain signal to impart said intermediate state of envelopes to said gain signal; a sixth step of modifying said intermediate state of envelopes into final state of envelopes with a second attack time and a second release time in response to changes in level of said gain signal imparted said intermediate state of envelopes; a seventh step of multiplying said audio signal by said gain signal with said final state of envelopes; and an eighth step of outputting said audio signal multiplied by said gain signal.

According to the seventh aspect of the present invention, there is provided an envelope generation program, comprising: a first step of having a signal inputted; a second step of generating intermediate state of envelopes with a first attack time and a first release time in response to changes in level of said signal inputted in said first step; a third step of respectively modifying said intermediate state of envelopes into final state of envelopes with a second attack time and a second release time in response to changes in level of said signal imparted said intermediate state of envelopes; and a fourth step of outputting said signal with said final state of envelopes.

According to the eighth aspect of the present invention, there is provided an audio compression program, comprising: a first step of having an audio signal inputted; a second step of periodically sampling said audio signal to obtain an absolute value in level of said audio signal; a third step of acquiring a difference between said absolute value and a predetermined threshold value; a fourth step of generating a gain signal based on said difference between said absolute value and said predetermined threshold value; a fifth step of generating intermediate state of envelopes with a first attack time and a first release time in response to changes in level of said gain signal to impart said intermediate state of envelopes to said gain signal; a sixth step of modifying said intermediate state of envelopes into final state of envelopes with a second attack time and a second release time in response to changes in level of said gain signal imparted said intermediate state of envelopes; a seventh step of multiplying said audio signal by said gain signal with said final state of envelopes; and an eighth step of outputting said audio signal multiplied by said gain signal.

According to the ninth aspect of the present invention, there is provided an audio expansion program, comprising: a first step of having an audio signal inputted; a second step of periodically sampling said audio signal to obtain an absolute value in level of said audio signal; a third step of acquiring a difference between said absolute value and a predetermined threshold value; a fourth step of generating a gain signal based on said difference between said absolute value and said predetermined threshold value; a fifth step of generating intermediate state of envelopes with a first attack time and a first release time in response to changes in level of said gain signal to impart said intermediate state of envelopes to said gain signal; a sixth step of modifying said intermediate state of envelopes into final state of envelopes with a second attack time and a second release time in response to changes in level of said gain signal imparted said intermediate state of envelopes; a seventh step of multiplying said audio signal by said gain signal with said final state of envelopes; and an eighth step of outputting said audio signal multiplied by said gain signal.

BRIEF DESCRIPTION OF THE DRAWINGS

The features and advantages of an envelop generator, an audio compression apparatus and an expansion apparatus according to the present invention will more clearly be understood from the following description taken in conjunction with the accompanying drawings in which:

FIG. 3 is a flowchart of an envelope generation process performed in the first embodiment of the audio compression apparatus according to the present invention.

DESCRIPTION OF THE PREFERRED EMBODIMENTS

The first preferred embodiment of the audio compression apparatus and the audio expansion apparatus according to the present invention will now be described in detail in accordance with the accompanying drawings.

Figure 1:
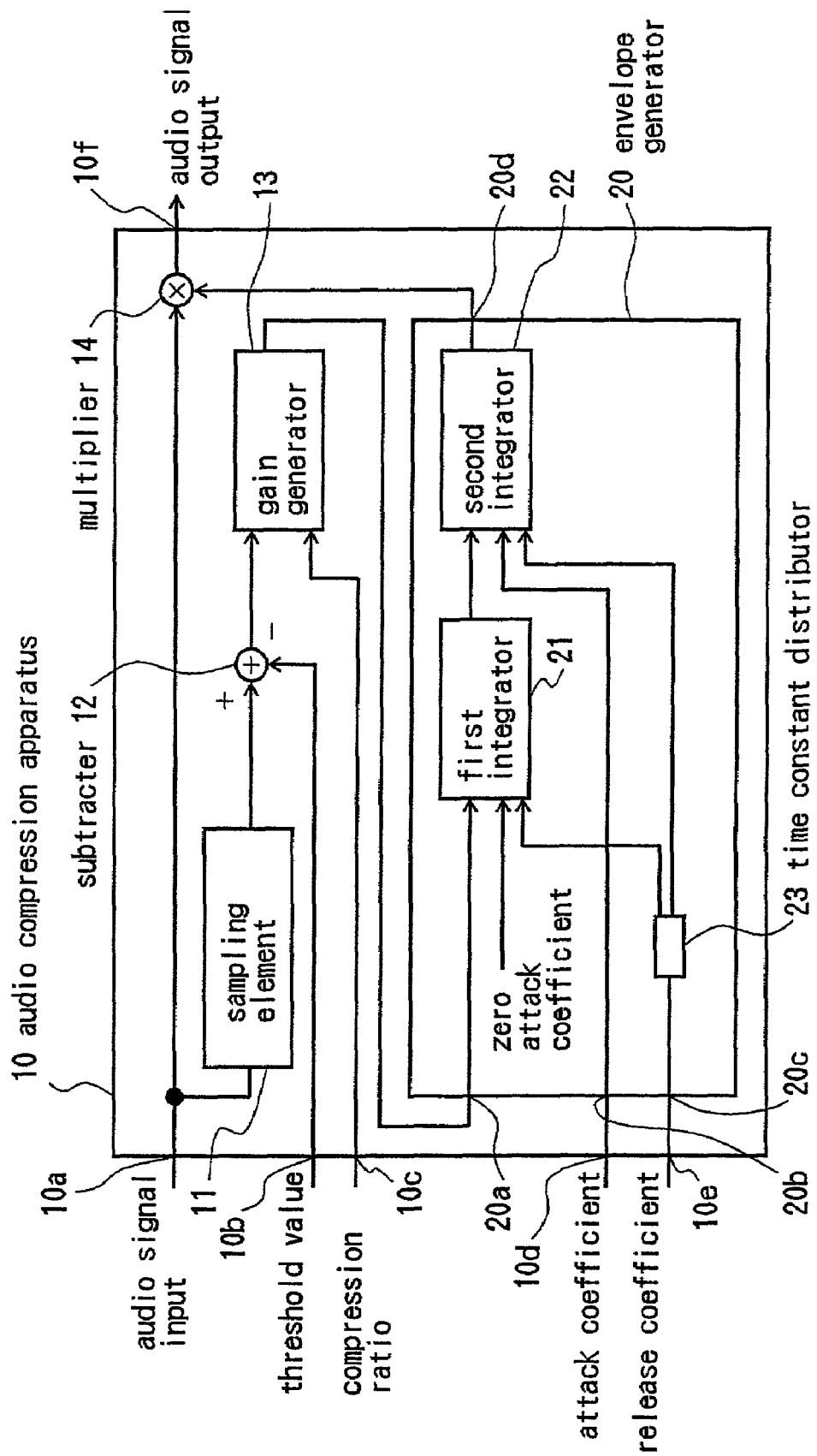
FIG. 1 is a block diagram of the first embodiment of the audio compression apparatus according to the present invention.

Referring to the drawings, in particular FIG. 1, there is shown a first preferred embodiment of the audio compression apparatus according to the present invention. The following description will accompany various technical terms defined as follows. The term "audio compression apparatus" is intended to mean an apparatus which can compress the levels of an audio signal inputted therein. The term "gain signal" is intended to mean a signal, the levels of which is multiplied by the levels of audio signal. Each gain value represented by each level of the gain signal is generally in range from "0" to "1" in an audio compression apparatus, and this general principle is available in the present embodiment of the audio compression apparatus according to the present invention. The audio compression apparatus is generally designed to change a gain value "1" to less than "1" when the level of audio signal becomes larger than a predetermined threshold value, and to restore the gain value to "1" when the level of audio signal returns to the predetermined threshold value. The term "attack time" is intended to mean a time constant which corresponds to a transient period of the gain signal at the beginning of the compression of the audio signal. The term "release time" is intended to mean a time constant which corresponds to a transient period of the gain signal at the end of the compression of the audio signal. The term "envelope generator" is intend to mean an apparatus which has the time constant to generate and impart envelopes to the gain signal in level.

The audio compression apparatus 10 comprises a sampling element 11, a subtracter 12, a gain generator 13, a multiplier 14, an envelope generator 20, an audio signal input terminal 10a, a threshold value input terminal 10b, a compression ratio input terminal 10c, an attack coefficient input terminal 10d, a release coefficient input terminal 10e, and an audio signal output terminal 10f.

The audio signal input terminal 10a has an audio signal inputted therein. The sampling element 11 is operative to periodically sample the audio signal inputted through the audio signal input terminal 10a at predetermined sampling clock cycle to obtain an absolute value in level of the audio signal. The threshold value input terminal 10b has a predetermined threshold value inputted therein. The subtracter 12 is operative to acquire a difference between the absolute value in level of the audio signal and the predetermined threshold value inputted through the threshold value input terminal 10b. The compression ratio input terminal 10c has a predetermined compression ratio inputted therein. The gain generator 13 is operative to generate a gain signal based on the predetermined compression ratio and on the difference between the absolute value and the threshold value. The gain signal represents values in range from "0" to "1". The gain generator 13 is designed to calculate a value approximate to an ideal characteristic with the polynomial expression of a rational function. The attack coefficient input terminal 10d has a predetermined attack coefficient inputted therein. The release coefficient input terminal 10e have a predetermined release coefficient inputted therein. The envelope generator 20 is operative to generate a plurality of desired envelopes in response to changes in level of the gain signal generated by the gain generator 13. The envelope generator 20 has a desired attack time and a desired release time. The desired attack time corresponds to the predetermined attack coefficient inputted through the attack coefficient input terminal 10d. The desired release time corresponds to the predetermined release coefficient through the attack coefficient input terminal 10d. The multiplier 14 is operative to multiply the audio signal from the audio signal input terminal 10a by the gain signal including the envelopes from the envelope generator 20. The audio signal output terminal 10f is operative to output the audio signal therethrough.

The envelope generator 20 comprises a first integrator 21, a second integrator 22, a time constant distributor 23, a gain signal input terminal 20a, an attack coefficient input terminal 20b, a release coefficient input terminal 20c, and a gain signal output terminal 20d.

The gain signal input terminal 20a has the gain signal inputted therein. The attack coefficient input terminal 20b has the desired attack coefficient inputted therein. The release coefficient input terminal 20c has the desired release coefficient inputted therein. The time constant distributor 23 is operative to receive the desired release coefficient to distribute a first release coefficient to the first integrator 21 and a second release coefficient to the second integrator 22.

The first release coefficient corresponds to a first release time which is half of the desired release time. The second release coefficient corresponds to a second release time which is half of the desired release time. The first integrator 21 is operative to receive the gain signal inputted through the gain signal input terminal 20a, a zero attack coefficient as a first attack coefficient, and the first release coefficient distributed from the time constant distributor 23. The first integrator 21 has a first attack time equal to zero corresponding to the first attack coefficient and a first release time corresponding to the first release coefficient. And the first integrator 21 is operative to generate intermediate state of envelopes in response to changes in level of the gain signal inputted through the gain signal input terminal 20a to impart the intermediate state of to the gain signal. The second integrator 22 is operative to receive the gain signal imparted the intermediate state of envelopes, a desired attack coefficient as a second attack coefficient, and receive the second release coefficient distributed from the time constant distributor 23. The second integrator 22 has a second attack time corresponding to the second attack coefficient and a second release time corresponding to the second release coefficient. And the second integrator 22 is operative to modify the intermediate state of envelopes into the final state of envelopes in response to changes in level of the gain signal imparted the first envelopes. The gain signal output terminal 20d is operative to output the gain signal imparted the final state of envelopes therethrough.

Figure 2:
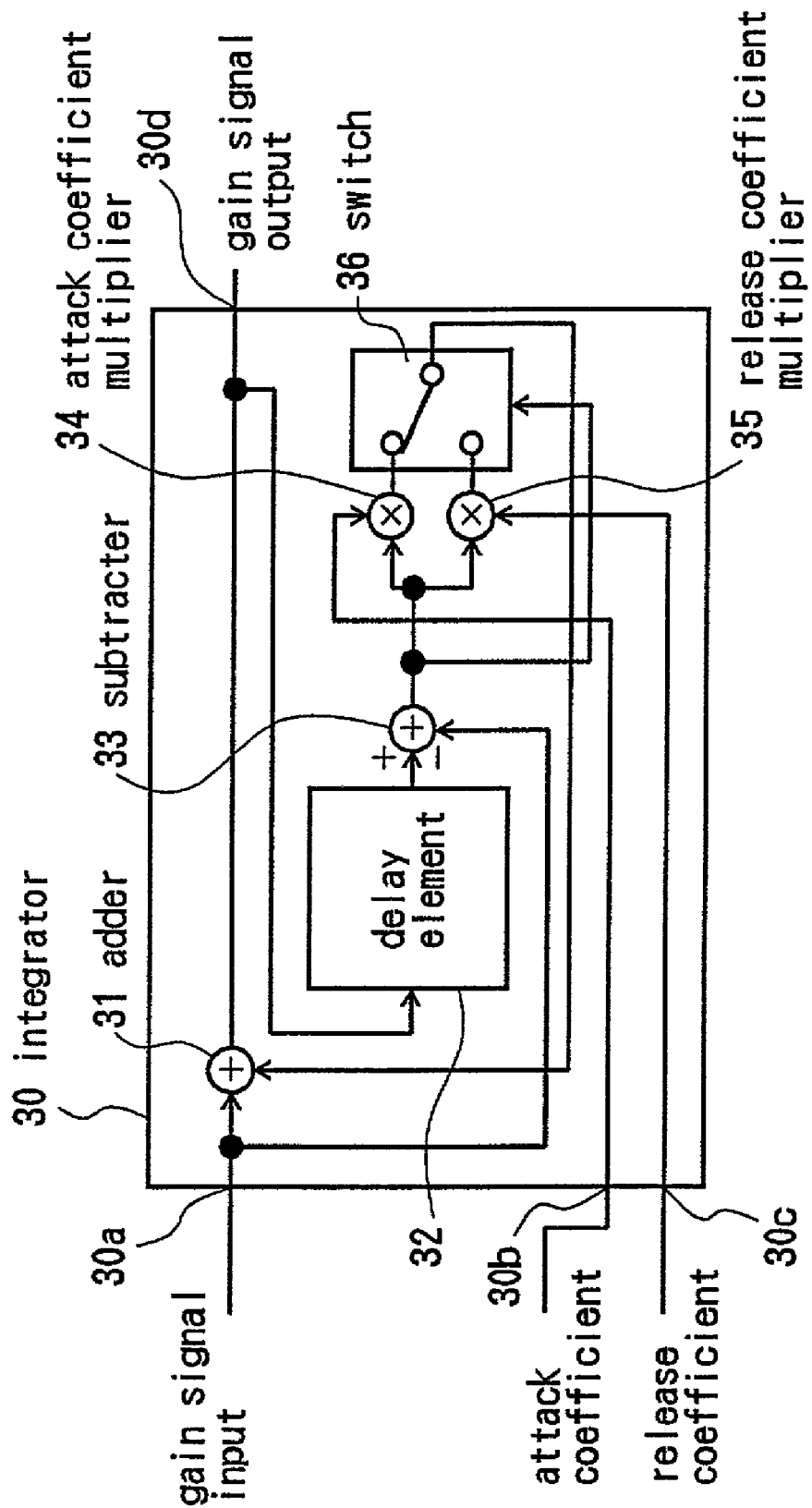
FIG. 2 is a block diagram of an example of an integrator forming part of the first embodiment of the envelope generator according to the present invention.

The first integrator 21 is same as integrator 30 shown in FIG. 2. The second integrator 22 is also same as integrator 30 shown in FIG. 2.

The integrator 30 comprises a adder 31, a delay element 32, a subtracter 33, an attack coefficient multiplier 34, a release coefficient multiplier 35, a switch 36, a gain signal input terminal 30a, an attack coefficient input terminal 30b, a release time coefficient input terminal 30c, and a gain signal output terminal 30d.

The gain signal input terminal 30a has a gain signal inputted therein. The delay element 32 is operative to delay the signal one sampling cycle. The subtracter 33 is operative to subtract the level of the gain signal from the one sampling cycle preceding level of the gain signal. The attack coefficient multiplier 34 is operative to multiple the level of the signal from the subtracter 33 by the attack coefficient imputed through the attack coefficient input terminal 30b. The release coefficient multiplier 35 is operative to multiple the level of the signal from the subtracter 33 by the release coefficient inputted through the release coefficient input terminal 30c. The switch 36 is operative to connect the attack coefficient multiplier 34 with the adder 31 during the attack time, and connect the release coefficient multiplier 35 with the adder 31 during the release time, based on the level of the signal from subtracter 33. The adder 31 is operative to add a level of the gain signal from the gain signal input terminal 30a to a level of the signal from the switch 36. The gain signal output terminal 30d is operative to output the gain signal imparted the envelopes therethrough.

The operation of the envelope generator 20 for the audio compression will then be described with reference to FIGS. 1 to 5.

Figure 4:
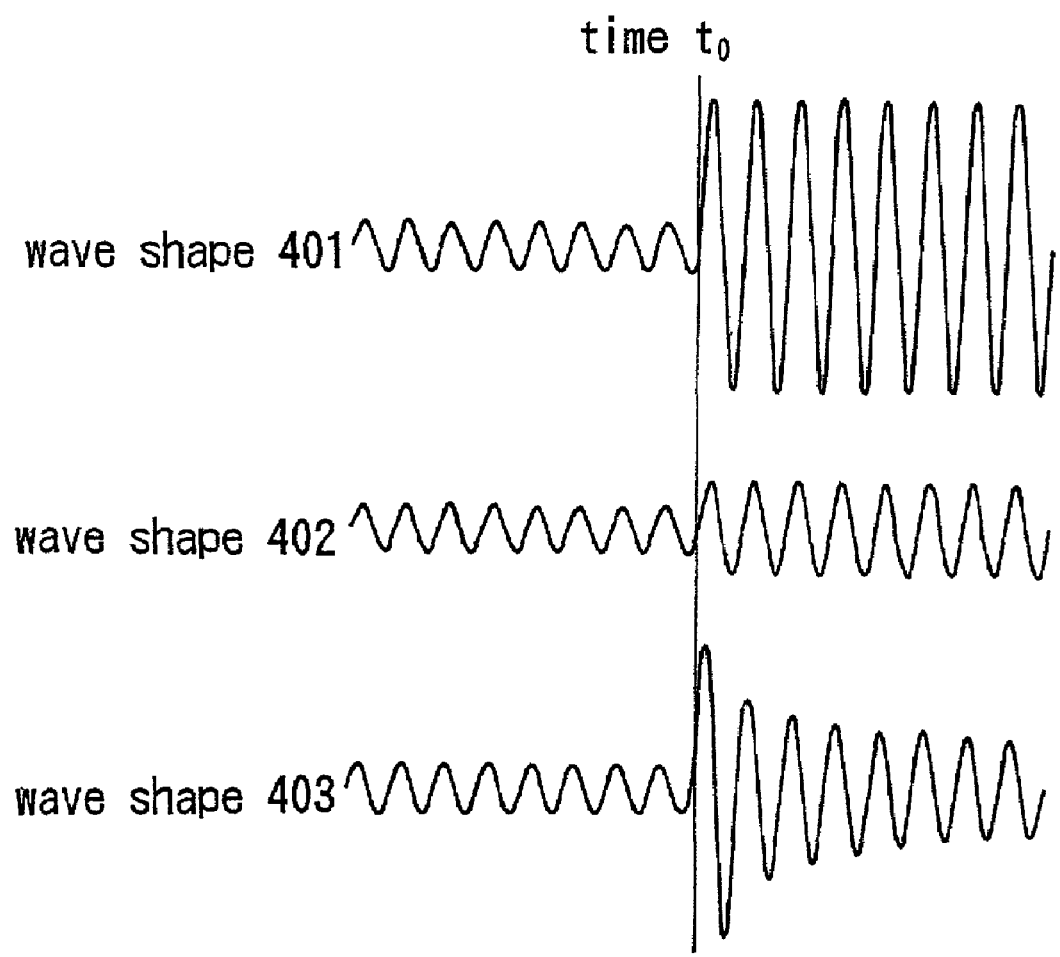
FIG. 4 is a first wave shape diagram of the audio signal inputted and outputted by the first embodiment of the audio compression apparatus according to the present invention.
Figure 5:
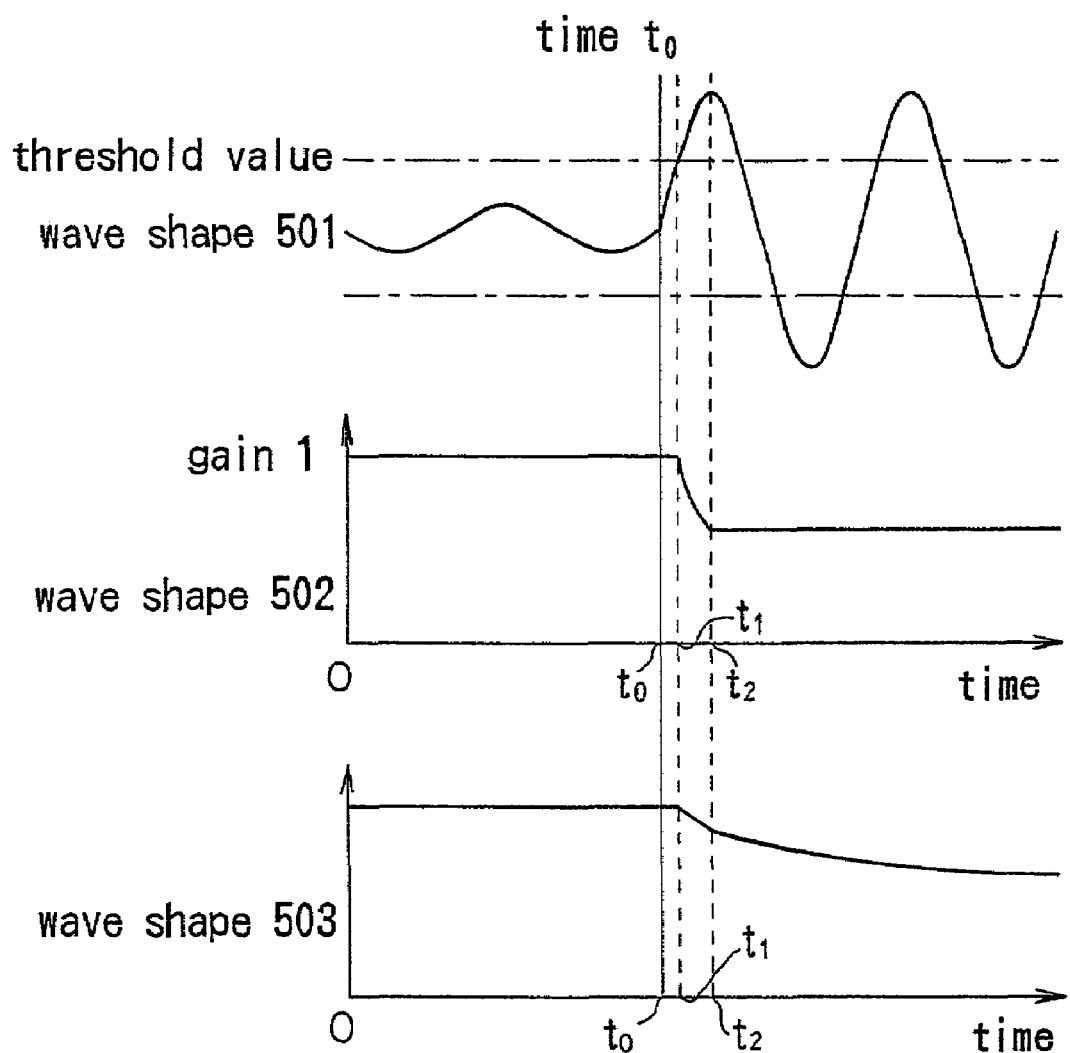
FIG. 5 is a second wave shape diagram of the gain signal inputted and outputted by the first embodiment of the envelop generator forming part of the audio compression apparatus according to the present invention.

It is assumed that the audio compression apparatus 10 has inputted therein an audio signal having a wave shape 401 shown in FIG. 4, becoming large in amplitude from the time t0 and compressed from the time t1. In this case, the wave shape 401 is varied with a predetermined attack coefficient to be outputted in a wave shape 403. For better understanding of the operation of envelope generator 20, it is assumed that only the first integrator 21 is operated while the operation of the second integrator 22 is ignored. The first integrator 21 having an attack coefficient set at zero results in generating a wave shape 402 shown in FIG. 4. The reason why such a wave shape is generated will then be described hereinafter with reference to the wave shapes shown in FIGS. 4 and 5 as well as with reference to the flow chart shown in FIG. 3. The envelope generator 20 has gain signal inputted therein in Step 301. The inputted gain signal continues to decrease in level from the time t1 to the time t2, when the inputted audio signal exceeds the threshold value in level. This means that the "yes" judgment continues in Step 302a. Under these conditions, the zero attack coefficient, i.e., the first attack coefficient being affected in Step 302b, i.e., with no operation of the first and second integrators, so that the gain signal having the wave shape 502 is outputted in Step 304.

During the time t2 to the time when the inputted audio signal becomes less than the threshold, the gain inputted to the envelope generator 20 continues to increase, with the result that the judgment "no" continues in Step 302a, the first release coefficient affected in Step 302c. As a result, the inputted gain signal is provided with a half of the desired release time. If the release time is longer than the cycle of the audio signal having wave shape 401, the first release time causes the gain held at the level corresponding to the peak of the audio signal. Until the absolute value in level of audio signal reaches its next peak, the gain at the audio signal peak is compared with the gain instantly inputted, the judgment "no" continues in Step 302a due to the gain at the audio signal peak smaller than the gain instantly inputted.

If the second integrator 22 is ignored, the envelope generator 20 outputs the gain signal having a wave shape 502, so that the audio compression apparatus 10 outputs the audio signal having a wave shape 402. After time t2, the gain is maintained at a substantially constant level corresponding to the peak of the audio signal in level, thereby making it possible to produce an audio signal compressed without being broken in shape.

Figure 12:
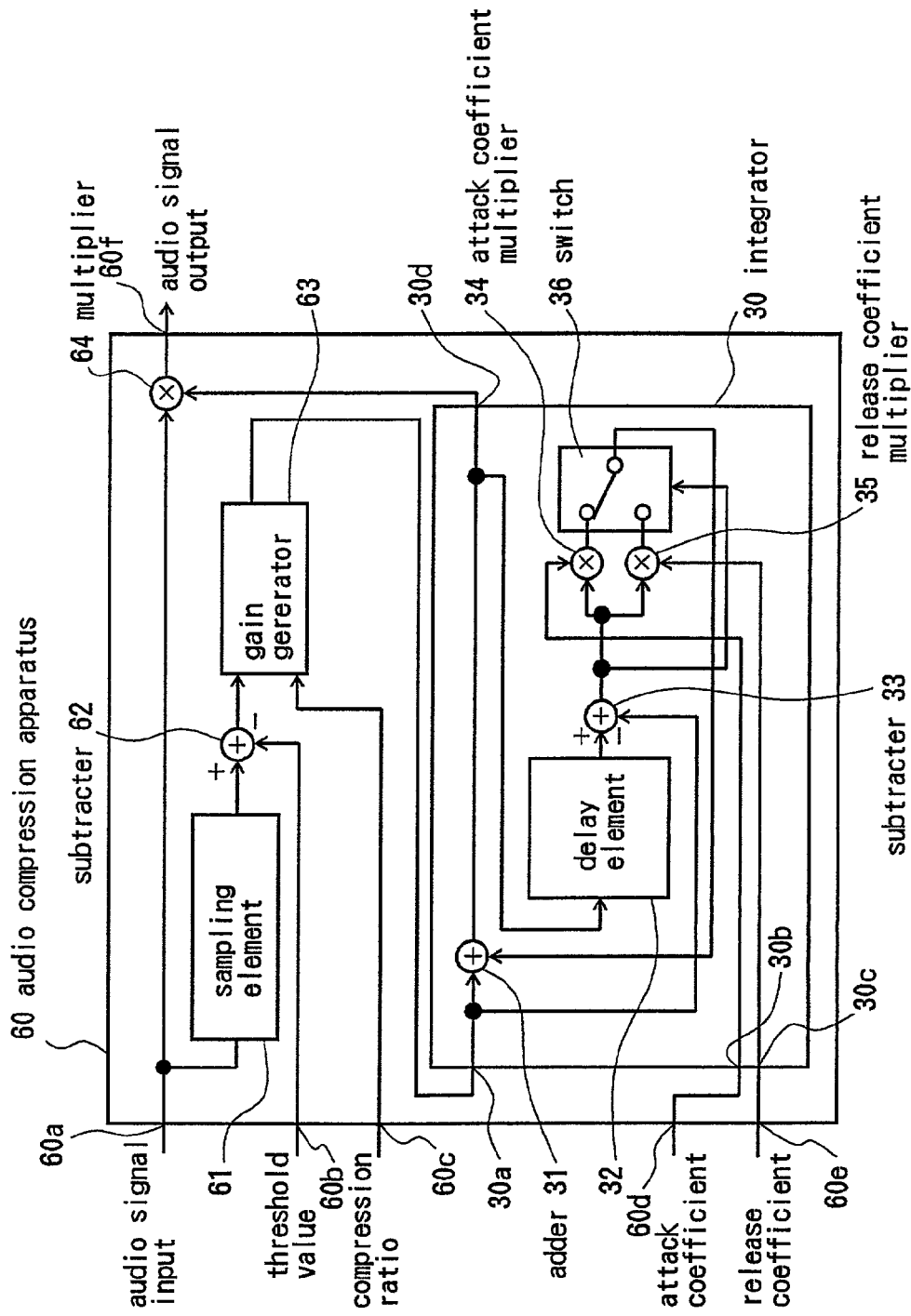
FIG. 12 is a block diagram of a conventional audio compression apparatus.

Here, the second integrator 22 will then be considered. The second integrator 22 is operated to generate an envelope corresponding to the desired attack time. The gain signal inputted to the first integrator 21 is generally oscillated every sampling time and thus has an alternative current component relatively large in proportion. The relatively large attack time given causes a problem that there is generated no gain having an exact value converged even if a sufficient time passes to the time constant as stated in the above. The above problem is caused similarly to the problem caused by the case that the one integrator 30 is used as a conventional envelope generator in FIG. 12. However, the second integrator 22 has an inputted gain signal smoothed by the first integrator 21. With the inputted audio signal keeping a constant amplitude, the output level of the first integrator 21 becomes a substantially constant level and is thus not fluctuated for every sampling time. The attack time passed causes the output of the second integrator 22 to converge toward the output of the first integrator 21 having a constant level. The gain inputted into the second integrator 22 at the time t1 being small is judged as a beginning of an attack time, and thus in Step 303a shown in the flow chart is then judged as "yes". The second attack coefficient, i.e., the desired attack coefficient inputted through the attack coefficient input terminal 10d is applied to the attack time. The level of the gain signal outputted from the second integrator 22 is converged the desired gain value being equal to the level of the gain signal obtained for the attack time zero.

Thus, with the second integrator 22 being considered, the envelope generator 20 outputs the gain signal having a wave shape 503, so that the audio compression apparatus 10 outputs the audio signal having a wave shape 403. The converged level of the gain signal is by no means fluctuated depending upon the desired attack time.

As for the release time, the time constant distributor 23 is operated to cause the first integrator 21 to function so that the gain signal is outputted from the first integrator 21 with a first release time half of the desired release time. The remaining release time i.e., the second release time half of the desired release time is provided by the second integrator 22. From the flowchart shown in FIG. 3 it will be understood that the judgment "no" is made in Steps 302a and 303a.

The first and the second integrators 21 and 22 is operated to have the totals of the attack times and the total of the release times respectively become desired time constant respectively determined by the desired attack coefficient and the desired release coefficient.

Figure 6:
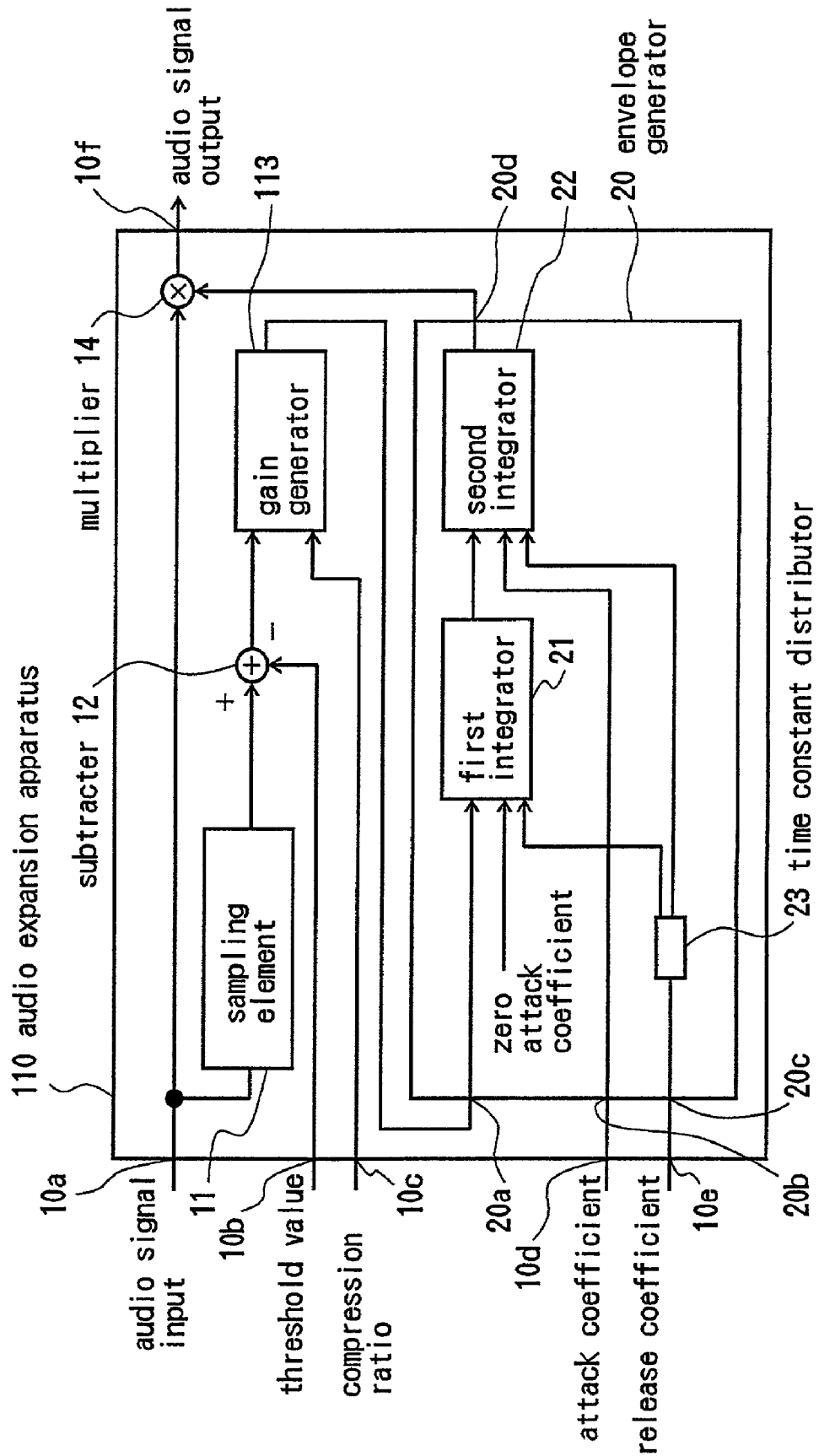
FIG. 6 is a block diagram similar to FIG. 1 but showing the first embodiment of the audio expansion apparatus according to the present invention.
Figure 7:
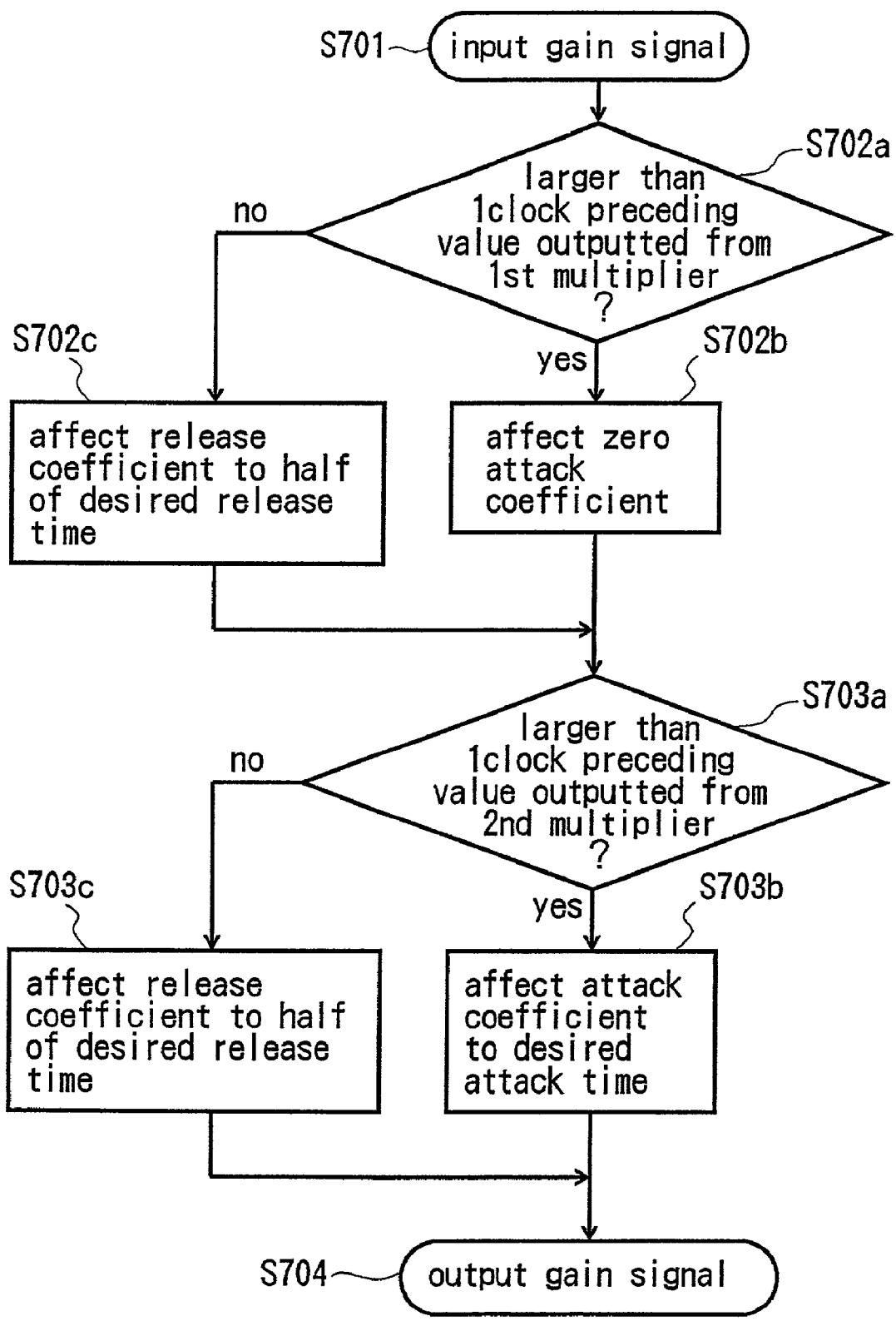
FIG. 7 is a flowchart similar to FIG. 3 but showing the first embodiment of the audio expansion apparatus according to the present invention.

Referring to the drawings, in particular FIG. 6, there is shown a first preferred embodiment of the audio expansion apparatus according to the present invention. The following description will accompany various technical terms defined as follows. The term "audio expansion apparatus" is intended to mean an apparatus which can substantially expand the levels of an audio signal inputted. The term "gain signal" is intended to mean a signal, the levels of which is multiplied by the levels of audio signal. Each gain value represented by each level of the gain signal is generally in range from "0" to "1" in an audio expansion apparatus, and this general principle is available in the present embodiment of the audio expansion apparatus according to the present invention. The audio expansion apparatus is generally designed to change a gain value "1" to less than "1" when the level of audio signal becomes less than a predetermined threshold value, and restores the gain value to "1" when the level of audio signal returns to the predetermined threshold value. The term "attack time" is intended to mean a time constant which corresponds to a transient period of the gain signal at the beginning of the substantial expansion of the audio signal, i.e., the end of the compression of the audio signal. The term "release time" is intended to mean a time constant which corresponds to a transient period of the gain signal at the end of the substantial expansion of the audio signal, i.e., the beginning of the compression of the audio signal. The term "envelope generator" is intend to mean an apparatus which has the time constant to generate and impart envelopes to the gain signal in level.

The audio expansion apparatus 110 comprises a sampling element 11, a subtracter 12, a gain generator 113, a multiplier 14, an envelope generator 20, an audio signal input terminal 10a, a threshold value input terminal 10b, a compression ratio input terminal 10c, an attack coefficient input terminal 10d, a release coefficient input terminal 10e, and an audio signal output terminal 10f.

The audio signal input terminal 10a has an audio signal inputted therein. The sampling element 11 is operative to periodically sample the audio signal inputted through the audio signal input terminal 10a at predetermined sampling clock cycle to obtain an absolute value in level of the audio signal. The threshold value input terminal 10b has a predetermined threshold value inputted therein. The subtracter 12 is operative to acquire a difference between the absolute value in level of the audio signal and the predetermined threshold value inputted through the threshold value input terminal 10b. The compression ratio input terminal 10c has a predetermined compression ratio inputted therein. The gain generator 113 is operative to generate a gain signal based on the predetermined compression ratio and on the difference between the absolute value and the threshold value. The gain signal represents values in range from "0" to "1". The gain generator 113 changes a gain value "1" to less than "1" when the level of audio signal becomes less than a predetermined threshold value, and restores the gain value to "1" when the level of audio signal returns to the predetermined threshold value to cause expansion in appearance. The gain generator 113 is designed to calculate a value approximate to an ideal characteristic with the polynomial expression of a rational function. The attack coefficient input terminal 10d has a predetermined attack coefficient inputted therein. The release coefficient input terminal 10e have a predetermined release coefficient inputted therein. The envelope generator 20 is operative to generate a plurality of desired envelopes in response to changes in level of the gain signal generated by the gain generator 113. The envelope generator 20 has a desired attack time and a desired release time. The desired attack time corresponds to the predetermined attack coefficient inputted through the attack coefficient input terminal 10d. The desired release time corresponds to the predetermined release coefficient through the attack coefficient input terminal 10d. The multiplier 14 is operative to multiply the audio signal from the audio signal input terminal 10a by the gain signal including the envelopes from the envelope generator 20. The audio signal output terminal 10f is operative to output the audio signal therethrough.

The envelope generator 20 comprises a first integrator 21, a second integrator 22, a time constant distributor 23, a gain signal input terminal 20a, an attack coefficient input terminal 20b, a release coefficient input terminal 20c, and a gain signal output terminal 20d.

The gain signal input terminal 20a has the gain signal inputted therein. The attack coefficient input terminal 20b has the desired attack coefficient inputted therein. The release coefficient input terminal 20c has the desired release coefficient inputted therein. The time constant distributor 23 is operative to receive the desired release coefficient to distribute a first release coefficient to the first integrator 21 and a second release coefficient to the second integrator 22. The first release coefficient corresponds to a first release time which is half of the desired release time. The second release coefficient corresponds to a second release time which is half of the desired release time. The first integrator 21 is operative to receive the gain signal inputted through the gain signal input terminal 20a, a zero attack coefficient as a first attack coefficient inputted through the attack coefficient input terminal 20b, and the first release coefficient distributed from the time constant distributor 23. The first integrator 21 has a first attack time equal to zero corresponding to the first attack coefficient and a first release time corresponding to the first release coefficient. And the first integrator 21 is operative to generate intermediate state of envelopes in response to changes in level of the gain signal inputted through the gain signal input terminal 20a to impart the intermediate state of envelopes to the gain signal. The second integrator 22 is operative to receive the gain signal imparted the intermediate state of envelopes, a desired attack coefficient as a second attack coefficient, and receive the second release coefficient distributed from the time constant distributors 23. The second integrator 22 has a second attack time corresponding to the second attack coefficient and a second release time corresponding to the second release coefficient. And the second integrator 22 is operative to modify the intermediate state of envelopes into final state of envelopes in response to changes in level of the gain signal imparted the first envelopes. The gain signal output terminal 20d is operative to output the gain signal imparted the final state of envelopes therethrough. The first integrator 21 is same as integrator 30 shown in FIG. 2. The second integrator 21 is also same as integrator 30 shown in FIG. 2.

The operation of the envelope generator 20 for the audio expansion will then be described with reference to FIGS. 6 to 9.

Figure 8:
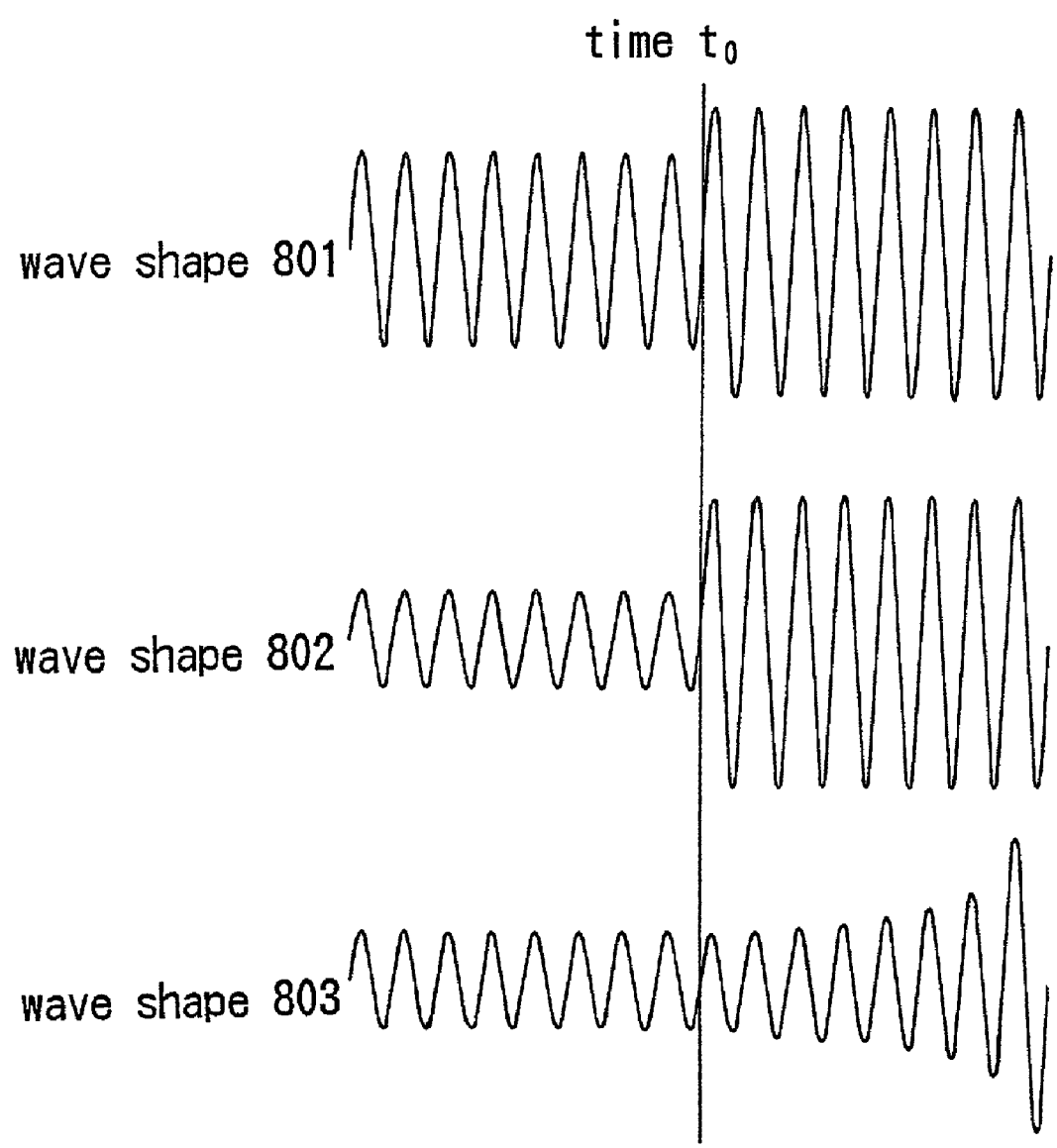
FIG. 8 is a third wave shape diagram similar to FIG. 4 but showing the first embodiment of the audio expansion apparatus according to the present invention.

It is assumed that the audio expansion apparatus 110 has inputted therein an audio signal having a wave shape 801 shown in FIG. 8, becoming large in amplitude from the time t0, compressed prior to the time t3, and decompressed from the time t3. In this case, the wave shape 801 is varied with a predetermined attack coefficient to be outputted in a wave shape 803. For better understanding of the operation of envelope generator 20, it is assumed that only the first integrator 21 is operated while the operation of the second integrator 22 is ignored. The first integrator 21 having an attack coefficient set at zero results in generating a wave shape 902 shown in FIG. 9. The reason why such a wave shape is generated will then be described hereinafter with reference to the wave shapes shown in FIGS. 8 and 9 as well as with reference to the flow chart shown in FIG. 7. The envelope generator 20 has gain signal inputted therein in Step 701. Prior to the time t3, the inputted gain signal has a maximum value at the peak of the audio signal, and the inputted gain signal continues to decrease in level during the inputted audio signal continues to decrease from the peak to zero in level. This means that the "no" judgment continues in Step 702a. If the release time is longer than the cycle of the audio signal having wave shape 801, the first release time causes the gain held at the level corresponding to the peak of the audio signal. Thus prior to the time t3, the gain is maintained at a substantially constant level corresponding to the peak of the audio signal in level, thereby making it possible to produce an audio signal compressed without being broken in shape.

The inputted gain continues rising to the level "1" from the time t3 to the time t4, and the inputted gain is maintained "1" from the time t4 to the time when the inputted audio signal reaches its initial peak. This leads to the fact that the "yes" judgment continues in Step 702a, under the influence of the zero attack coefficient the first integrator 21 is not operated with the gain signal in Step 702b. From the time when the audio signal reaches its initial peak to the time when the audio signal is declined under the threshold value, the inputted gain is maintained at the level "1", and the outputted gain from first integrator 21 is also maintained at the level "1". The inputted audio signal continues declining from the threshold value to zero value, thereof "no" judgment is made in Step 702a, so that the first release coefficient is influenced with the release time half of the release time in Step 702c. Here, if the release time is longer than the cycle of the inputted audio signal, the first release time causes the outputted gain held at the level "1". To the time when the inputted audio signal reaches the threshold value again, the inputted gain raises but does not reach the level "1", i.e., the outputted gain from the first integrator 21 at the preceding sampling time, thereby making the "no" judgment continues in Step 702a. This means that the outputted gain from the first integrator 21 is maintained at around the level "1". It is therefore understood that the second integrator 22 ignored causes the outputted audio signal to maintain the wave shape and be compressed before the time t3. Further, the second integrator 22 ignored causes the outputted audio signal to maintain unchanged after the time t4. It is therefore to be noted that the second integrator 22 ignored causes the outputted audio signal to have the wave shape 802.

Figure 9:
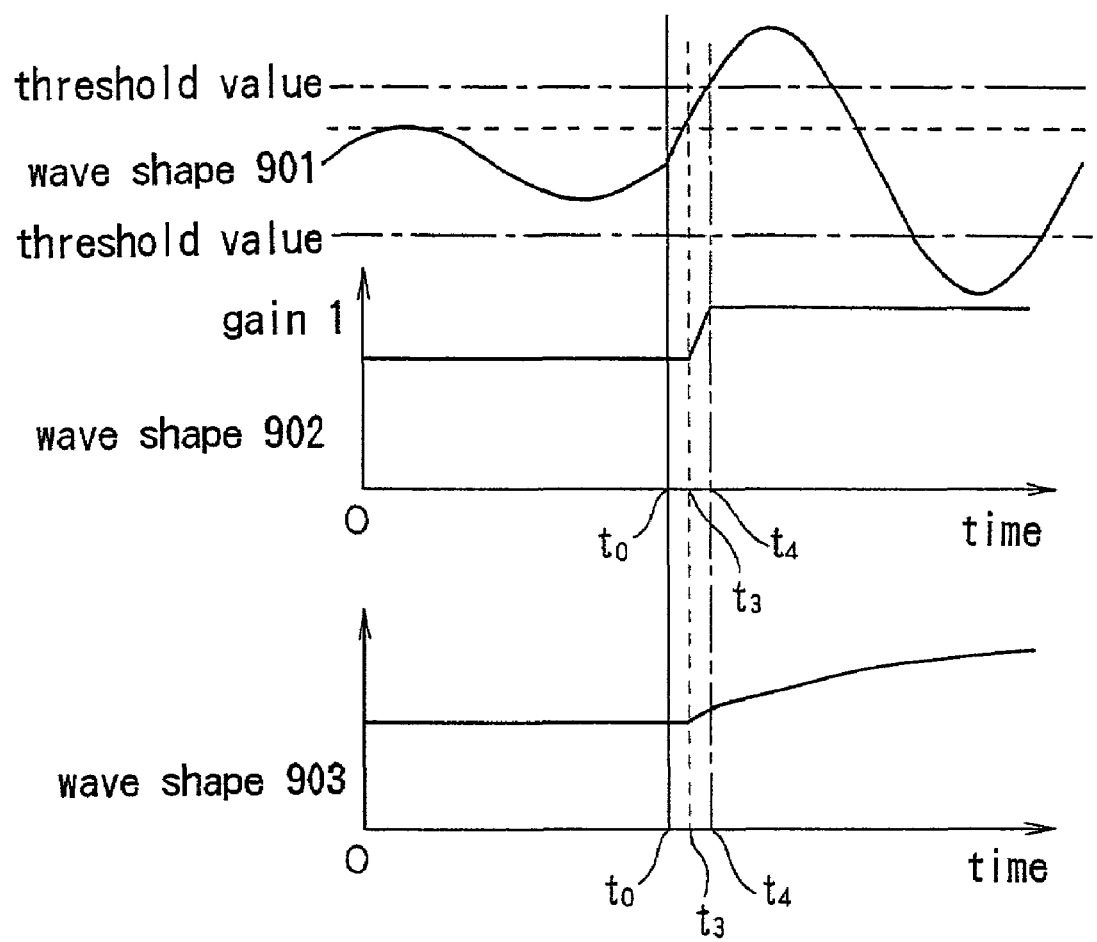
FIG. 9 is a fourth wave shape diagram similar to FIG. 5 but showing the first embodiment of the audio expansion apparatus according to the present invention.

Here, the second integrator 22 will then be considered. The second integrator 22 is operated to generate an envelope corresponding to the desired attack time. The gain signal inputted to the first integrator 21 is generally oscillated every sampling time and thus has an alternative current component relatively large in proportion. The relatively large attack time given causes a problem that there is generated no gain having an exact value converged even if a sufficient time passes to the time constant as stated in the above. The above problem is caused similarly to the problem caused by the case that the one integrator 30 is used as a conventional envelope generator in FIG. 12. However, the second integrator 22 has an inputted gain signal smoothed by the fist integrator 21, so that the second integrator 22 performs exact attack and release processes. When the level of the inputted gain signal begins to increase, the second integrator 22 is operated to judge the beginning of the attack time. This means that the "yes" judgement made in Step 703a in FIG. 7, thereby the attack coefficient inputted through the attack coefficient input terminal 10d is applied in Step 703b. The wave shape 903 of the gain signal is obtained as seen in FIG. 9.

As for the release time, the gain signal inputted into the first integrator 21 fluctuates in level from "1" to the less than "1". In the other word, the inputted gain signal is changed from the fixed level to the level at the beginning of the attack time. Here, the time constant distributor 23 is operated to cause the first integrator 21 to function so that the gain signal is outputted from the first integrator 21 with a first release time half of the desired release time. The remaining release time i.e., the second release time of the desired release time is provided by the second integrator 22. From the flowchart shown in FIG. 7 it will be understood that the judgment "no" is made in Steps 702a and 703a.

The first and the second integrators 21 and 22 is operated to have the totals of the attack times and the total of the release times respectively become desired time constant respectively determined by the desired attack coefficient and the desired release coefficient.

The second preferred embodiment of the audio compression apparatus and the audio expansion apparatus according to the present invention will now be described in detail in accordance with the accompanying drawings.

Figure 10:
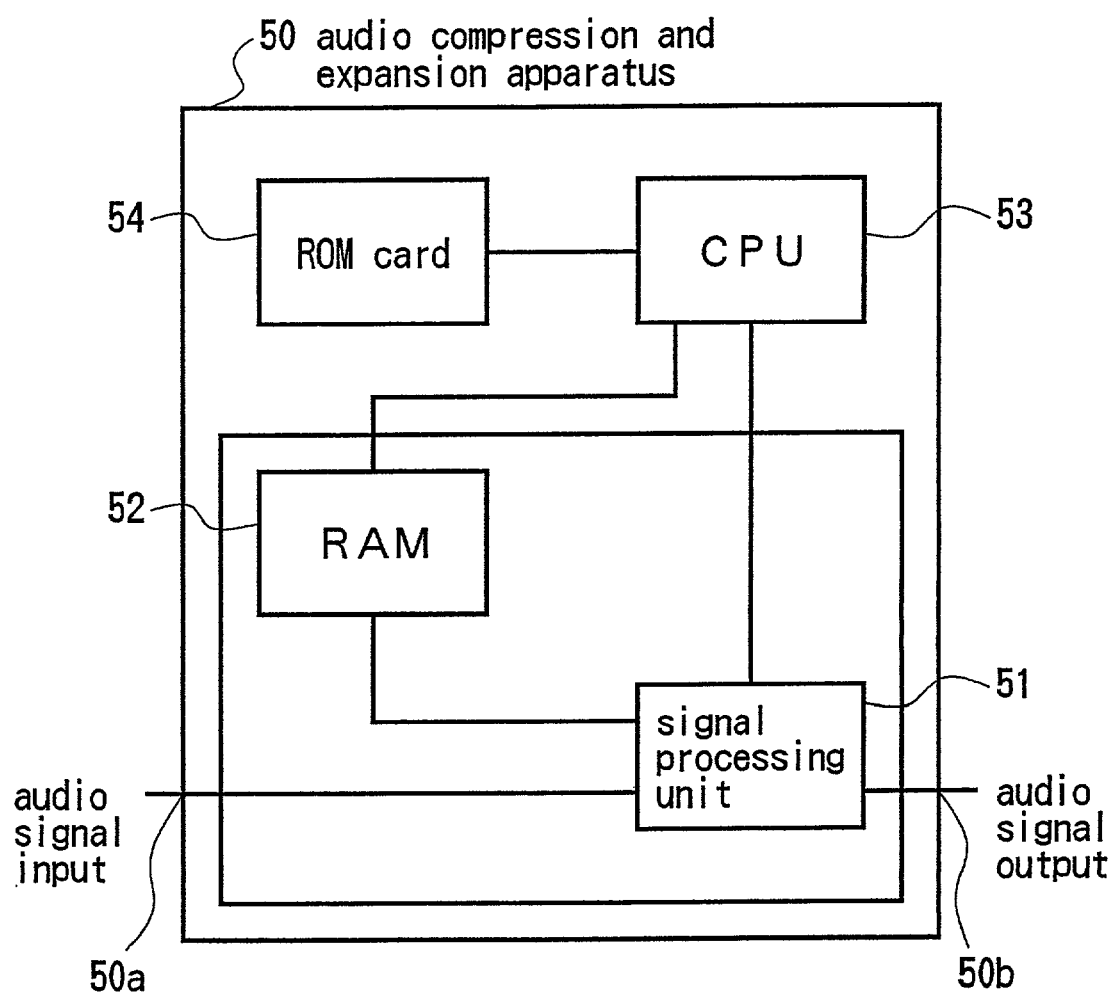
FIG. 10 is a block diagram of the second embodiment of the audio compression and expansion apparatus according to the present invention.

Referring to the drawings, in particular FIG. 10, there is shown the second preferred embodiment of the audio compression and expansion apparatus according to the present invention.

The audio compression and expansion apparatus 50 comprises a signal processing unit 51, a RAM 52, a CPU 53, a ROM card 54, an audio signal input terminal 50a, and an audio signal output terminal 50b.

The audio signal input terminal 50a has an audio signal inputted therein. The signal processing unit 51 is operative to follow and execute instructions from the CPU 53 to compress and expand the level of the audio signal inputted through the audio signal input terminal 50a. The RAM 52 is operative to record various temporary values and various temporary data to compress and expand the level of the audio signal inputted through the audio signal input terminal 50a. The CPU 53 is operative to execute the steps by audio compression and expansion program with the signal processing unit 51 for compressing and expanding the level of the audio signal inputted through the audio signal input terminal 50a. The ROM card 54 is operative to record in advance the audio compression and expansion program which makes the CPU 53 execute the steps of compressing levels of the audio signal inputted through the audio signal input terminal 50a. The ROM card 54 is also operative to record various predetermined value such as a desired attack coefficient, a desired release coefficient, threshold values for compression, a compression ratio. The audio signal output terminal 50b is operative to output the audio signal of which level controlled by the CPU 53 and the signal processing unit 51 therethrough.

Figure 11:
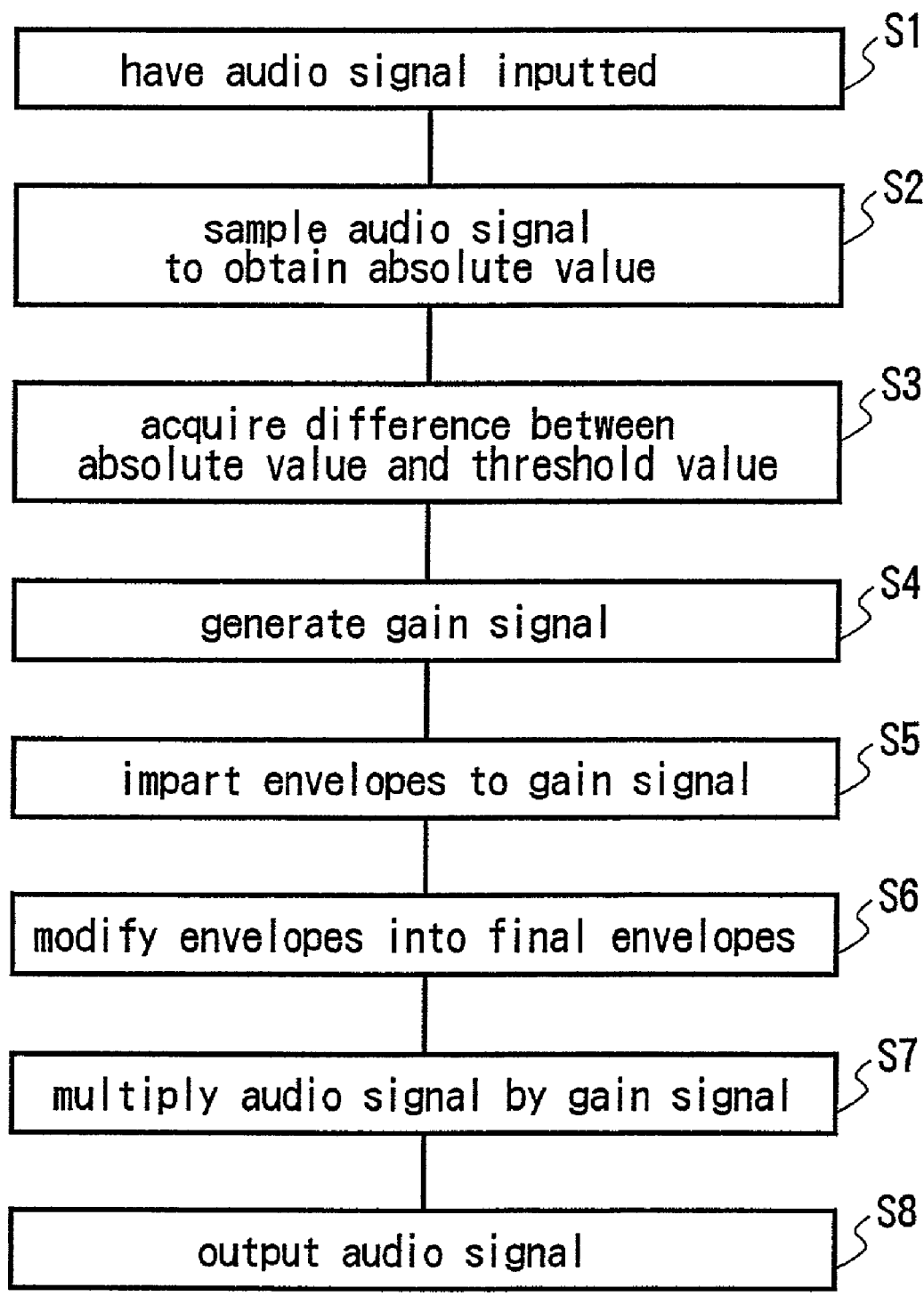
FIG. 11 is a flowchart of the process performed by the second embodiment of the audio compression and expansion apparatus according to the present invention.

FIG. 11 shows a flowchart representing an audio compression and expansion process performed by the embodiment of the audio compression and expansion apparatus according to the present invention. The steps shown in FIG. 11 are executed by the CPU 53 cooperated with the signal processing unit 51. In step S1, an audio signal is inputted into the signal processing unit 51 through the audio signal input terminal 50a. In step S2, the signal processing unit 51 periodically sample the audio signal and the CPU 53 obtains an absolute value in level of the audio signal. In step S3, the CPU 53 acquires a difference between the absolute value in level of the audio signal and the predetermined threshold value recorded in the RAM 52. In step S4, the CPU 53 generates a gain signal based on the predetermined compression ratio recorded in the RAM 52 and on the deference between the absolute value and on the predetermined threshold value acquired in the step S3. In the case of audio compression, the CPU 53 changes the gain "1" to less than "1" when the level of the audio signal becomes larger than the threshold value. In the case of audio expansion, the CPU 53 changes the gain "1" to less than "1" when the level of the audio signal becomes less than the threshold value. In step S5, the CPU 53 generates the intermediate state of envelopes with a first attack time and a first release time in response to changes in level of the gain signal to impart the intermediate state of envelopes to the gain signal. In the case of the audio compression, The CPU 53 executes the steps S302a, S302b, S302c shown FIG. 3 as step S5. In the case of the audio expansion, The CPU 53 executes the steps S702a, S702b, 702c shown FIG. 7 as step S5. In step S6, the CPU 53 modifies the intermediate state of envelopes into final state of envelopes with a second attack time and a second release time in response to changes in level of the gain signal imparted said intermediate state of envelopes in the step S5. In the case of the audio compression, The CPU 53 executes the steps S303a, S303b, S303c shown FIG. 3 as step S6. In the case of the audio expansion, The CPU 53 executes the steps S703a, S703b, S703c shown FIG. 7 as step S6. In step S7, the CPU 53 multiplies the audio signal by the gain signal. In step S8, the audio signal is outputted through the audio signal output terminal 50b.

The second embodiment of the audio compression and expansion apparatus 50 described above is including the ROM card 54 as a recording media which records the audio compression and expansion program, the present invention of an audio compression and expansion apparatus is not limited to this embodiment, the recording media may be replaced by any other recording media such as a disk. In the case that the recording media is a disk, the audio compression and expansion apparatus may be including a disk drive for reading the audio compression and expansion program and the data such as threshold values, a compression ratio, an attack coefficient, and a release coefficient.

Though the first and second embodiments of an audio compression apparatus and audio expansion apparatus multiply the audio signal by the gain signal having range from "0" to "1", this invention of the an audio compression apparatus and audio expansion apparatus is not limited that range. According to the present invention of an audio compression apparatus and audio expansion apparatus may multiply the audio signal by the gain signal having range from "0" to "2" or the other range.

Further, according to the present invention of an audio compression apparatus and audio expansion apparatus may input a plural of audio signals and output a plural of audio signals for stereo audio.

Further, according to the present invention of an envelope generator, an audio compression apparatus and audio expansion apparatus allow to generate envelops with various combination of the first release time and the second release times that total of those becomes the desired release time, though the distributing half of the desired release time to integrators is convenient and better for simplifying in construction.

The following is examples of the time constant (the attack time and the release time) and the coefficient (the attack coefficient and the release coefficient). In the case of the time constant T larger than zero, the coefficient C is defined by the equation: $C=\exp(-1/(Fs \times T+1))$ where Fs is the sampling frequency. In the case of the time constant equal to zero, the coefficient C is zero. For example, the frequency Fs is 48 kHz. In the case of the desired attack time: 1 ms, the first attack coefficient: zero and the second attack coefficient: 0.9798. In the case of the desired attack time: 50 ms, the first attack coefficient: 0 and the second attack coefficient: 0.9995. In the case of the desired release time: 1 s, the first release coefficient and the second release coefficient are respectively 0.99995 corresponding to the release time: 500 ms. In the case of the desired release time: 500 ms, the first release coefficient and the second release coefficient are respectively 0.99991 corresponding to the release time 250 ms.

From the above detailed description, it will be understood that the envelope generator thus constructed as previously mentioned ensures a double envelope generation, i.e., a first integration for generating first envelopes as intermediate envelopes during a first attack time and with a first release time in response to changes in level of a gain signal, and a second integration for respectively modifying the first envelopes into second envelopes as final envelopes with a second attack time and during a second release time in response to changes in level of the gain signal imparted the first envelopes. This means that the envelope generator according to the present invention can compress or expand level of the audio signal with relatively high quality not to break in shape and can be relatively simple in construction.

What is claimed is:

1. An envelope generator, comprising:
an input terminal for having a signal inputted therein;
a first integrator for generating intermediate state of envelopes with a first attack time and a first release time in response to changes in level of said signal inputted through said input terminal to impart said intermediate state of envelopes to said signal;
a second integrator for respectively modifying said intermediate state of envelopes into final state of envelopes with a second attack time and a second release time in response to changes in level of said signal outputted from said first integrator to impart said final state of envelopes to said signal;
a time constant distributor for receiving a desired release coefficient to distribute a first release coefficient to said first integrator and a second release coefficient to said second integrator, said first release coefficient corresponding to said first releasing time of said first integrator, said second release coefficient corresponding to said second releasing time of said second integrator; and
an output terminal for outputting said signal with said final state of envelopes therethrough, wherein
said first attack time is equal to zero,
said second attack time corresponds to a desired attack coefficient, and
the sum of said first release coefficient to be distributed to said first integrator and said second release coefficient to be distributed to said second integrator is equal to said desired release coefficient.

2. An audio compression apparatus, comprising:
an input terminal for having an audio signal inputted therein;
a sampling element for periodically sampling said audio signal to obtain an absolute value in level of said audio signal;
a subtracter for acquiring a difference between said absolute value and a predetermined threshold value;
a gain generator for generating a gain signal based on said difference between said absolute value and said predetermined threshold value;
an envelope generator including a first integrator for generating intermediate state of envelopes with a first attack time and a first release time in response to changes in level of said gain signal to impart said intermediate state of envelopes to said gain signal, and a second integrator for respectively modifying said intermediate state of envelopes into final state of envelopes with a second attack time and a second release time in response to changes in level of said gain signal outputted from said first integrator to impart said final state of envelopes to said gain signal, a time constant distributor for receiving a desired release coefficient to distribute a first release coefficient to said first integrator and a second release coefficient to said second integrator, said first release coefficient corresponding to said first releasing time of said first integrator, said second release coefficient corresponding to said second releasing time of said second integrator;
a multiplier for multiplying said audio signal by said gain signal with said final state of envelopes; and
an output terminal for outputting said audio signal multiplied by said gain signal therethrough, wherein
said first attack time is equal to zero,
said second attack time corresponds to a desired attack coefficient, and
the sum of said first release coefficient to be distributed to said first integrator and said second release coefficient to be distributed to said second integrator is equal to said desired release coefficient.

3. An audio expansion apparatus, comprising:
an input terminal for having an audio signal inputted therein;
a sampling element for periodically sampling said audio signal to obtain an absolute value in level of said audio signal;
a subtracter for acquiring a difference between said absolute value and a predetermined threshold value;
a gain generator for generating a gain signal based on said difference between said absolute value and said predetermined threshold value;
an envelope generator including a first integrator for generating intermediate state of envelopes with a first attack time and a first release time in response to changes in level of said gain signal to impart said intermediate state of envelopes to said gain signal, and a second integrator for respectively modifying said intermediate state of envelopes into final state of envelopes with a second attack time and a second release time in response to changes in level of said gain signal outputted from said first integrator to impart said final state of envelopes to said gain signal, a time constant distributor for receiving a desired release coefficient to distribute a first release coefficient to said first integrator and a second release coefficient to said second integrator, said first release coefficient corresponding to said first releasing time of said first integrator, said second release coefficient corresponding to said second releasing time of said second integrator;

a multiplier for multiplying said audio signal by said gain signal with said final state of envelopes; and an output terminal for outputting said audio signal multiplied by said gain signal therethrough, wherein said first attack time is equal to zero, said second attack time corresponds to a desired attack coefficient, and the sum of said first release coefficient to be distributed to said first integrator and said second release coefficient to be distributed to said second integrator is equal to said desired release coefficient.

4. An envelope generation method, comprising:

a first step of having a signal inputted;

a second step of generating intermediate state of envelopes with a first attack time and a first release time in response to changes in level of said signal inputted in said first step to impart said intermediate state of envelopes to said signal;

a third step of respectively modifying said intermediate state of envelopes into final state of envelopes with a second attack time and a second release time in response to changes in level of said signal outputted in said second step to impart said final state of envelopes to said signal a fourth step of outputting said signal with said final state of envelopes; and a fifth step of receiving a desired release coefficient to distribute a first release coefficient and a second release coefficient, said first release coefficient corresponding to said first releasing time, said second release coefficient corresponding to said second releasing time, wherein said first attack time is equal to zero, said second attack time corresponds to a desired attack coefficient, and the sum of said first release coefficient to be distributed and said second release coefficient to be distributed is equal to said desired release coefficient.

5. An audio compression method, comprising:

a first step of having an audio signal inputted;

a second step of periodically sampling said audio signal to obtain an absolute value in level of said audio signal;

a third step of acquiring a difference between said absolute value and a predetermined threshold value;

a fourth step of generating a gain signal based on said difference between said absolute value and said predetermined threshold value;

a fifth step of generating intermediate state of envelopes with a first attack time and a first release time in response to changes in level of said gain signal to impart said intermediate state of envelopes to said gain signal;

a sixth step of modifying said intermediate state of envelopes into final state of envelopes with a second attack time and a second release time in response to changes in level of said gain signal outputted in said fifth step to impart said final state of envelopes to said gain signal;

a seventh step of multiplying said audio signal by said gain signal with said final state of envelopes; and an eighth step of outputting said audio signal multiplied by said gain signal; and a ninth step of receiving a desired release coefficient to distribute a first release coefficient and a second release coefficient, said first release coefficient corresponding to said first releasing time, said second release coefficient corresponding to said second releasing time, wherein said first attack time is equal to zero, said second attack time corresponds to a desired attack coefficient, and the sum of said first release coefficient to be distributed and said second release coefficient to be distributed is equal to said desired release coefficient.

6. An audio expansion method, comprising:

a first step of having an audio signal inputted;

a second step of periodically sampling said audio signal to obtain an absolute value in level of said audio signal;

a third step of acquiring a difference between said absolute value and a predetermined threshold value;

a fourth step of generating a gain signal based on said difference between said absolute value and said predetermined threshold value;

a fifth step of generating intermediate state of envelopes with a first attack time and a first release time in response to changes in level of said gain signal to impart said intermediate state of envelopes to said gain signal;

a sixth step of modifying said intermediate state of envelopes into final state of envelopes with a second attack time and a second release time in response to changes in level of said gain signal outputted in said sixth step to impart said final state of envelopes to said gain signal;

a seventh step of multiplying said audio signal by said gain signal with said final state of envelopes; and an eighth step of outputting said audio signal multiplied by said gain signal; and a ninth step of receiving a desired release coefficient to distribute a first release coefficient and a second release coefficient, said first release coefficient corresponding to said first releasing time, said second release coefficient corresponding to said second releasing time, wherein said first attack time is equal to zero, said second attack time corresponds to a desired attack coefficient, and the sum of said first release coefficient to be distributed and said second release coefficient to be distributed is equal to said desired release coefficient.

7. A recordable medium having stored thereon information on an envelope generation program having a computer perform an envelope generation, said envelope generation program comprising:

a first step of having a signal inputted;

a second step of generating intermediate state of envelopes with a first attack time and a first release time in response to changes in level of said signal inputted in said first step to impart said intermediate state of envelopes to said signal;

a third step of respectively modifying said intermediate state of envelopes into final state of envelopes with a second attack time and a second release time in response to changes in level of said signal outputted in said second step to impart said final state of envelopes to said signal a fourth step of outputting said signal with said final state of envelopes; and a fifth step of receiving a desired release coefficient to distribute a first release coefficient and a second release coefficient, said first release coefficient corresponding to said first releasing time, said second release coefficient corresponding to said second releasing time, wherein said first attack time is equal to zero, said second attack time corresponds to a desired attack coefficient, and the sum of said first release coefficient to be distributed and said second release coefficient to be distributed is equal to said desired release coefficient.

8. A recordable medium having stored thereon information on an audio compression program having a computer perform a compression of an audio signal, said audio compression program comprising:

a first step of having an audio signal inputted;

a second step of periodically sampling said audio signal to obtain an absolute value in level of said audio signal;

a third step of acquiring a difference between said absolute value and a predetermined threshold value;

a fourth step of generating a gain signal based on said difference between said absolute value and said predetermined threshold value;

a fifth step of generating intermediate state of envelopes with a first attack time and a first release time in response to changes in level of said gain signal to impart said intermediate state of envelopes to said gain signal;

a sixth step of modifying said intermediate state of envelopes into final state of envelopes with a second attack time and a second release time in response to changes in level of said gain signal outputted in said fifth step to impart said final state of envelopes to said gain signal;

a seventh step of multiplying said audio signal by said gain signal with said final state of envelopes; and an eighth step of outputting said audio signal multiplied by said gain signal; and a ninth step of receiving a desired release coefficient to distribute a first release coefficient and a second release coefficient, said first release coefficient corresponding to said first releasing time, said second release coefficient corresponding to said second releasing time, wherein said first attack time is equal to zero, said second attack time corresponds to a desired attack coefficient, and the sum of said first release coefficient to be distributed and said second release coefficient to be distributed is equal to said desired release coefficient.

9. A recordable medium having stored thereon information on an audio expansion program having a computer perform an expansion of an audio signal, said audio expansion program comprising:

a first step of having an audio signal inputted;

a second step of periodically sampling said audio signal to obtain an absolute value in level of said audio signal;

a third step of acquiring a difference between said absolute value and a predetermined threshold value;

a fourth step of generating a gain signal based on said difference between said absolute value and said predetermined threshold value;

a fifth step of generating intermediate state of envelopes with a first attack time and a first release time in response to changes in level of said gain signal to impart said intermediate state of envelopes to said gain signal;

a sixth step of modifying said intermediate state of envelopes into final state of envelopes with a second attack time and a second release time in response to changes in level of said gain signal outputted in said fifth step to impart said final state of envelopes to said gain signal;

a seventh step of multiplying said audio signal by said gain signal with said final state of envelopes; and an eighth step of outputting said audio signal multiplied by said gain signal; and a ninth step of receiving a desired release coefficient to distribute a first release coefficient and a second release coefficient, said first release coefficient corresponding to said first releasing time, said second release coefficient corresponding to said second releasing time, wherein said first attack time is equal to zero, said second attack time corresponds to a desired attack coefficient, and the sum of said first release coefficient to be distributed and said second release coefficient to be distributed is equal to said desired release coefficient.

* * * * *